United States Patent [19]

Yamada

[11] Patent Number: 5,313,081

[45] Date of Patent: May 17, 1994

[54] SOLID-STATE IMAGING DEVICE WITH TRANSPORT CHANNELS BETWEEN PHOTOSENSITIVE ELEMENTS

[75] Inventor: Tetsuo Yamada, Yokohama, Japan

[73] Assignee: Kabushiki Kaisha Toshiba, Kawasaki, Japan

[21] Appl. No.: 732,093

[22] Filed: Jul. 18, 1991

[30] Foreign Application Priority Data

Jul. 19, 1990 [JP] Japan ................................ 2-191282

[51] Int. Cl.⁵ .................... H01L 29/78; H01L 31/00; G11C 19/28
[52] U.S. Cl. .................................. 257/232; 257/233; 257/222; 257/223; 257/241
[58] Field of Search ..................... 377/62, 63; 357/24, 357/24 LR; 257/240, 249, 241, 232, 233, 222, 223

[56] References Cited

U.S. PATENT DOCUMENTS

| | | | |
|---|---|---|---|
| 4,291,239 | 9/1981 | Weimer | 357/24 |
| 4,622,567 | 11/1986 | Pals et al. | 357/24 |
| 4,663,771 | 5/1987 | Takeshita et al. | 357/24 |
| 4,805,026 | 2/1989 | Oda | 357/24 |
| 4,851,887 | 7/1989 | Hagiwara | 357/24 |
| 4,907,050 | 3/1990 | Yamada | 357/24 |
| 4,962,412 | 10/1990 | Shinohara et al. | 357/24 |
| 5,040,038 | 8/1991 | Yutani et al. | 357/24 |
| 5,111,263 | 5/1992 | Stevens | 357/24 |

FOREIGN PATENT DOCUMENTS

| | | | |
|---|---|---|---|
| 56-35466 | 4/1981 | Japan | 357/24 |
| 57-48260 | 3/1982 | Japan | 357/24 |
| 60-38869 | 2/1985 | Japan | 357/24 |

Primary Examiner—Rolf Hille
Assistant Examiner—Mahshid Saddat
Attorney, Agent, or Firm—Foley & Lardner

[57] ABSTRACT

There is provided a solid-state imaging device suitable for miniaturization. This solid-state imaging device comprises: a photosensitive element array in which photosensitive element trains are arranged in parallel with a predetermined spacing therebetween, each photosensitive element train being such that a plurality of photosensitive elements at least partially isolated from each other by device isolation layers are arranged in a train form; charge transfer sections each including charge transfer channel layers and a plurality of transfer electrodes in an interline form thereabove, arranged between the respective photosensitive element trains, and isolated from at least a portion adjacent to the photosensitive element array by the device isolation layers; channel regions formed in the regions between the photosensitive elements serving as the photosensitive element trains in a manner that they are adjacent to the device isolation layers and are connected to the charge transfer channel layers, and interconnection layers for connecting the electrodes in phase of the transfer electrodes provided above the device isolation layers and the channel regions, to control voltages applied to the transfer electrodes and the transfer electrode of the charge transfer section, thereby permitting each channel region between photosensitive elements to be used as a charge transport channel for transporting signal charges produced in the photosensitive elements to the charge transfer channel.

6 Claims, 4 Drawing Sheets

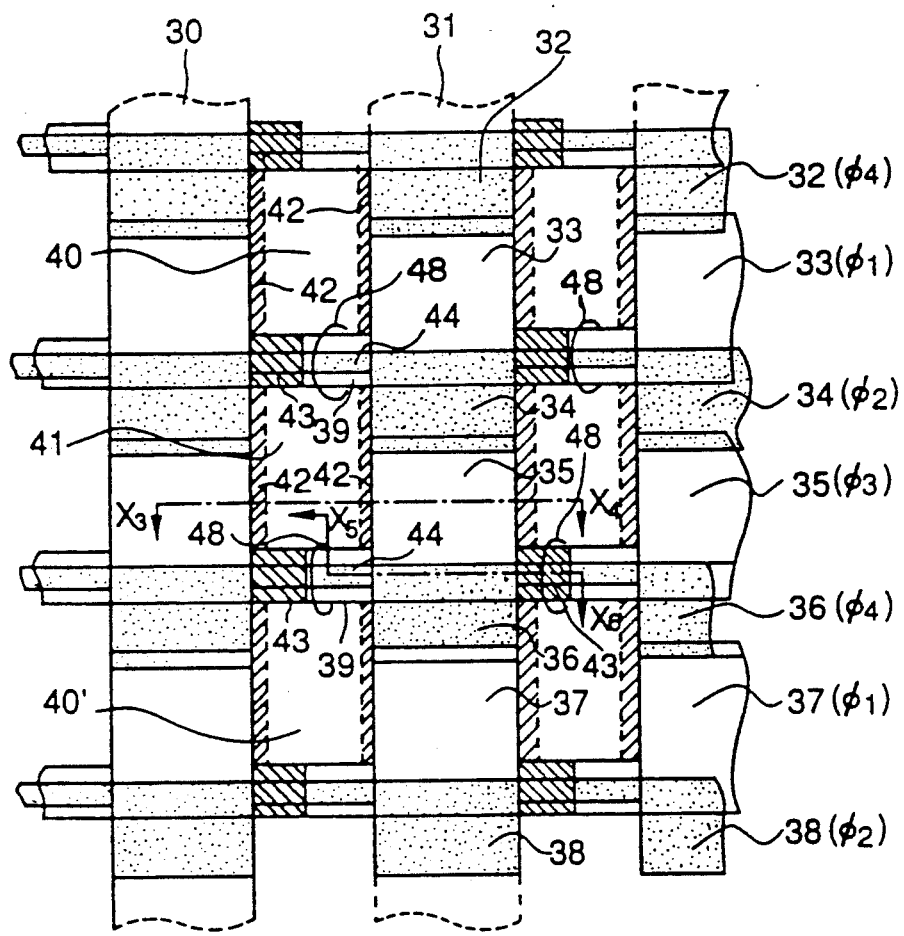
F I G . 4
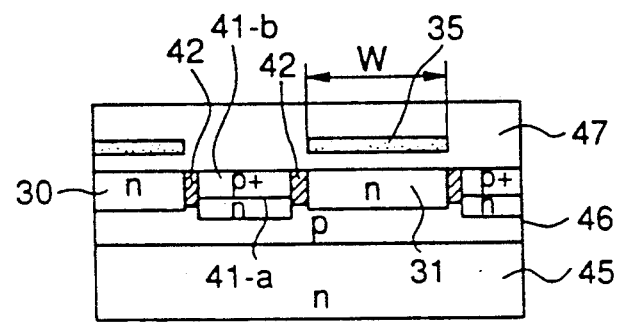
F I G . 5

SOLID-STATE IMAGING DEVICE WITH TRANSPORT CHANNELS BETWEEN PHOTOSENSITIVE ELEMENTS

BACKGROUND OF THE INVENTION

This invention relates to a solid-state imaging device, and more particularly to a solid-state imaging device having a miniaturized structure.

The configuration of a conventional typical solid-state imaging device when viewed from the plane is shown in FIG. 1. In this imaging device, photosensitive elements 2 and 3 formed on the surface of a semiconductor substrate and isolated in an X-direction and in a Y-direction by device isolation layers 1 indicated by slanting lines are arranged one after another in a train form. Adjacently to photosensitive element trains comprised of a plurality of photosensitive elements, a charge transfer channel 10 comprised of an impurity layer is provided. On the charge transfer channel 10, transfer electrodes 4, 5, 6 and 7 are successively formed in a repeated manner. These transfer electrodes are of well known superposed electrode structure, wherein the transfer electrodes 5 and 7 are a first layer electrode, and the transfer electrodes 4 and 6 are a second layer electrode. Generally, four-phase transfer pulses $\phi_1$ to $\phi_4$ are applied to these transfer electrodes to carry out the transfer operation. Namely, transfer pulses $\phi_1$ to $\phi_4$ are applied to the transfer electrodes 4, 5, 6 and 7, respectively.

Between the photosensitive sections 2 and 3 the charge transfer channel 10, charge transport channels 11 and 12 are provided, respectively. Between respective photosensitive sections 2 and 3, interconnection portions 24 connecting adjacent electrodes of the same phase are formed.

The operation of the imaging device thus constructed will now be described.

When a high voltage readout pulse is applied to the electrode 4, the charge transport channel 11 is turned ON. As a result, signal charges are transported from the photosensitive element 2 to the portion below a corresponding electrode of the charge transfer channel 10. Similarly, when a high voltage readout pulse is applied to the electrode 6, the charge transfer channel 12 is turned ON. As a result, signal charges are transported from the photosensitive element 3 to the portion below a corresponding electrode of the charge transfer channel 10. Thereafter, when well known four-phase pulses are applied to the transfer electrodes 4 to 7, signals are transferred in a lower direction of plane surface of paper.

It is to be noted that, in an ordinary operation, in accordance with the interlace operation in the well known television system in the first field (first charge readout), signal charges in the photosensitive elements 2 and 3 are added, and in the second field (second charge readout), signal charges in the photosensitive element 3 and the next photosensitive element 2 (represented by reference numeral 2' in FIG. 1 for convenience) are added. The signal charges thus added are read out. Such a readout system is generally known as the storage readout mode.

The configuration in cross section cut along the lines $X_1$-$X_2$ of FIG. 1 is shown in FIG. 2. A p-well 13 is formed on an $n^-$-type substrate 14. Within the region isolated by device isolation layers 1, there are formed a photosensitive element comprised of an n-type impurity layer 2-a and a p$^+$ type impurity layer 2-b covering the surface thereof, and a charge transfer channel 10 through a charge transport channel 11. An insulating film 15 is deposited on the substrate, and a transfer electrode 4 is formed in the insulating film above the charge transfer channel 10 and the charge transport channel 11.

FIG. 3 is a diagram showing the distribution of potentials at respective portions of the channel from the n-type impurity layer 2-a up to the charge transfer channel 10 via the charge transport channel 11 wherein reference numeral 23 represents a potential on the device isolation layer, reference numeral 22 a potential on the photosensitive element in a charge empty state, reference numeral 18 a potential on the charge transport channel in an ON state, reference numeral 19 a potential on the charge transport channel in an OFF state, reference numeral 20 a potential on the transfer electrode 4 in an ON state, and reference numeral 21 a potential on the transfer electrode in an OFF state.

Assuming now that the width of the transfer electrode 4 is W and the length between the photosensitive element 2 and the charge transfer channel 10 is L (see FIG. 1), let consider the case where the length L is short. In this case, when a large quantity of charges are stored into the n-type impurity layer 2-a of the photosensitive element by the short-channel effect well known as the phenomenon that the isolation characteristic between the photosensitive element and the transfer channel is deteriorated when the transfer electrode is in an OFF state, there occurs the phenomenon that a portion of the stored charges overflows into the charge transfer channel 10. This state is represented by reference symbol OFL in FIG. 3 as the overflow phenomenon that when the charge transport channel is in an OFF state and a potential thereon is thus represented by reference numeral 18, signal charges produced in the photosensitive element 2 climb over the potential barrier 18 to flow out into the charge transfer channel 10.

In order to eliminate such an undesired phenomenon, it is required to set the length L between the photosensitive element 2 and the charge transfer channel 10 to a value longer than a sufficiently large value (e.g. 1.5 $\mu$m).

On the other hand, the length L varies by $\pm\Delta L$ (e.g., $\pm 0.5$ $\mu$m) by errors in manufacturing the solid-state imaging device, e.g., various tolerances or alignment deviations, etc. Accordingly, when such errors in manufacturing are taken into consideration, the length L must be set to $L+\Delta L$.

From the above-mentioned circumstances, the width of the electrode cannot help being set to a value far larger than the width primarily required for transfer. This makes it difficult to ensure a sufficient photosensitive element area, resulting in lowered sensitivity and obstructions to the device miniaturization.

SUMMARY OF THE INVENTION

Accordingly, an object of this invention is to eliminate obstructions to device miniaturization due to the existence of the charge transport channel in the prior art to thereby provide a solid-state imaging device of a novel structure suitable for realization of miniaturized and high sensitivity devices.

In accordance with this invention, a charge transport channel is formed in the region between photosensitive elements, which was conventionally used merely as the interconnection region, and was considered as the portion which does not contribute to the operation of the device. Accordingly, the limitation in reduction of the width of the transfer electrode is removed. Thus, high sensitivity and miniaturized devices can be provided.

BRIEF DESCRIPTION OF THE DRAWINGS

In the accompanying drawings:

FIG. 4 is a plan view showing the structure of a solid-state imaging device according to a first embodiment of this invention;

FIGS. 5 and 6 are cross sectional views showing the structure of a solid-state imaging device according to the first embodiment of this invention;

DESCRIPTION OF THE PREFERRED EMBODIMENTS

Preferred embodiments of this invention will now be described with reference to the attached drawings.

Figure 1:
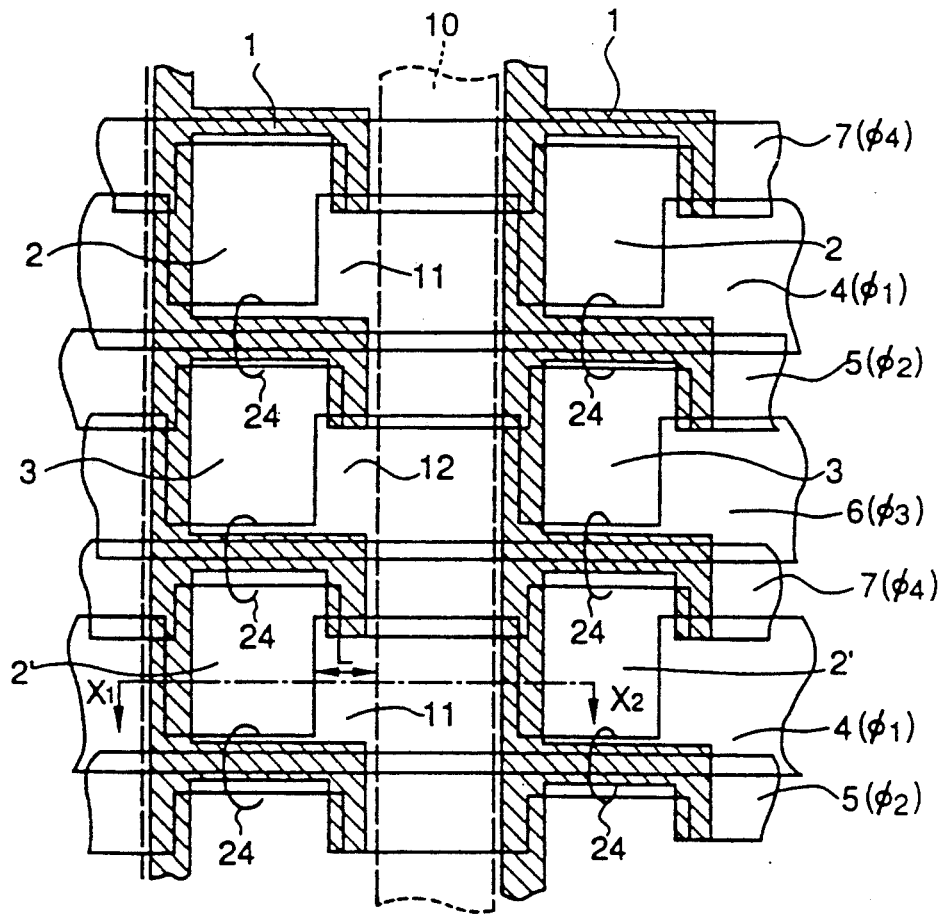
FIG. 1 is a plan diagram showing the structure of a conventional imaging device.
Figure 2:
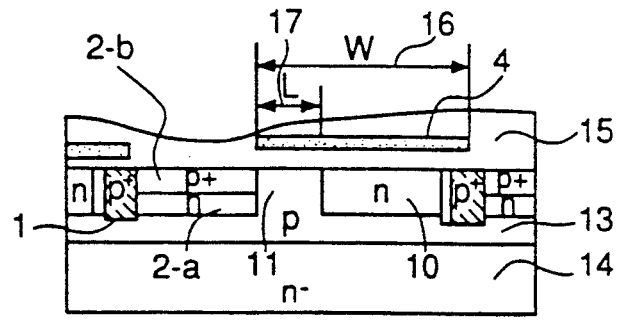
FIG. 2 is a cross sectional view showing the cross section of the conventional solid-state imaging device.
Figure 3:
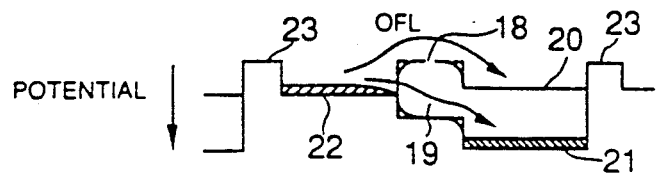
FIG. 3 is a potential distribution diagram in the structure of FIG. 2.
Figure 6:
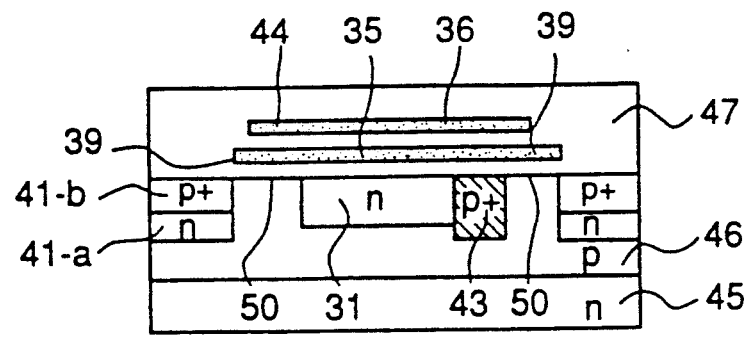

FIG. 4 is a plan view showing the plane structure of a first embodiment of this invention, FIG. 5 is a cross sectional view showing the state cut along the line $X_3$–$X_4$ thereof, and FIG. 6 is a cross sectional view showing the state cut along the line $X_5$–$X_6$ thereof. In these figures, a portion of photosensitive elements provided in a matrix form and the configuration for charge transfer is shown.

In FIGS. 4 and 5, two charge transfer channels 30 and 31 are shown. On these charge transfer channel layers, transfer electrodes 32 to 38 are provided. In the case of this embodiment, four-phase transfer $\phi_1$ to $\phi_4$ opulses are applied to these transfer electrodes. Namely, the transfer pulse $\phi_1$ is applied to the transfer electrodes 33 and 37, the transfer pulse $\phi_2$ is applied to the transfer electrodes 34 and 38, the transfer pulse $\phi_3$ is applied to the transfer electrode 35, and the transfer pulse $\phi_4$ is applied to the transfer electrodes 36 to 38. These transfer electrodes 33, 35 and 37 are comprised of a conductive material of the first layer, e.g., polysilicon, and the transfer electrodes 32, 34, 36 and 38 are comprised of a conductive material of the second layer, e.g., polysilicon. These electrodes constitutes a well known superposed electrode structure. Electrodes belonging to corresponding rows of respective columns are commonly connected within interconnection portions 48.

Between charge transfer channels, photosensitive element trains are formed. In respective photosensitive element trains, photosensitive elements 40 and 41 are formed one after another. Between these photosensitive elements 40 and 41 and the transfer channel layers 30 and 31, device isolation layers 42 for isolating them are formed. It is to be noted that while reference numeral 40' is attached for convenience to a certain photosensitive element in FIG. 4 in order to make a discrimination from the initial photosensitive element 40 in the following description, such a photosensitive element 40' is exactly the same as the photosensitive element 40.

In the region between photosensitive elements in upper and lower directions of plane surface of paper, no device isolation layer 42 is formed. This region serves as the interconnection region where the previously described interconnection portion 48 is formed.

Referring to FIG. 5, a p-well 46 is formed on the surface of an n-type substrate 45, and a photosensitive element 41 is formed between two charge transfer channels 30 and 31 formed on the surface thereof. This photosensitive element 41 includes an n-type layer 41-a, and a heavily doped (high concentration) p-type layer 41-b serving as the surface portion formed thereon, wherein the extending portions of the heavily doped p-type layer serve as device isolation layers 42, respectively. Since this device isolation layer is formed by ion-implantation in accordance with the self-alignment system using the transfer electrode 35 as a mask, the end portion of the transfer electrode 35 and the end portion of the device isolation layer 42 are substantially in correspondence with each other, and the charge transfer channel width and the transfer electrode width are also substantially in correspondence with each other.

As is clear from FIG. 6, the interconnection portion 48 is comprised of a interconnection portion 39 of the first layer electrode and a interconnection portion 44 of the second layer electrode formed through an insulating film 47 thereon, and is formed on the semiconductor substrate through an insulating film. At the semiconductor substrate surface portion of the substantially left half in the interconnection region between photosensitive elements adjacent in the upper and lower directions in FIG. 4, a p+-type device isolation layer 43 is formed.

The first embodiment is characterized in that no device isolation layer is formed at the semiconductor portion facing the interconnection portion 39 of the first layer electrode except for the region where the p+ type device isolation layer 43 is formed, and that the interconnection portion 44 of the second layer electrode is formed on the interconnection portion 39 of the first layer electrode through the insulating layer in a manner that it is not protruded therefrom.

In such a configuration, when a high voltage readout pulse is applied as the transfer pulse $\phi_1$, a channel is formed on the semiconductor surface facing the interconnection portion 39 of the first layer electrode. As a result, signal charges stored in the photosensitive elements 40 and 41 are transported into the portion below the interconnection portion 39 of the first layer electrode, and are further transported into the portion 31 controlled by the transfer electrode 33. Accordingly, the interconnection region between photosensitive elements, which was not effectively utilized, can be utilized as the charge transport channel.

Referring to FIG. 6, the semiconductor substrate surface region 50 below the interconnection portion 39 of the first layer electrode serves as the charge transport channel portion. As previously described, since the width W of the transfer electrode 35 is in correspondence with the width of the transfer channel layer 31, it is possible to most efficiently form the transfer portion from a viewpoint of area.

By applying four-phase pulses to respective electrodes, signal charges which have been read out are transferred from the upper direction of plane surface of paper to the lower direction thereof. In this case, by applying readout pulses of a high voltage to the transfer electrodes 33 and 37, signal charges produced in the photosensitive elements 40 and 41 are added and are read out. Thus, the first field readout is carried out. Further, by applying a readout pulse to the transfer electrode 35, signals charges produced in the photosensitive elements 41 and 40' are added and read out. Thus, the second field readout is carried out.

As stated above, in accordance with this invention, since a technique is employed to form the transport channel by making use of the portion which was conventionally invalid region without newly forming the transport channel, the device area can be reduced by the area occupied by the transport channel. Accordingly, not only the dimension of the device can be reduced to efficiently carry out miniaturization, but also the area for the photosensitive elements can be enlarged without changing the entire area by the area reduction of the transport channel thus to allow the device to have a high sensitivity.

Figure 7:
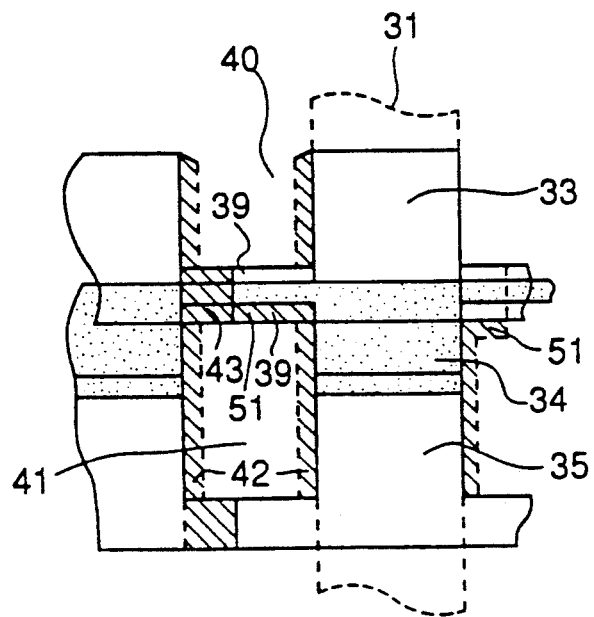
FIG. 7 is a plan view showing the structure of a solid-state imaging device according to a second embodiment of this invention.

A second embodiment of this invention is shown in FIG. 7. This embodiment has a configuration similar to that of the first embodiment, but differs from the latter in that a device isolation layer 51 is formed also at the boundary portion on the upper side of the photosensitive element 41 in FIG. 7, and that the electrode 39 serving as the electrode for charge readout channel is isolated by the device isolation layer 51. Thus, even if a readout pulse voltage is applied to the transfer electrode 33, signal charges produced in the photosensitive element 41 are not transported. As a result, it is possible to independently read out signal charges produced in the photosensitive element 40.

Figure 8:
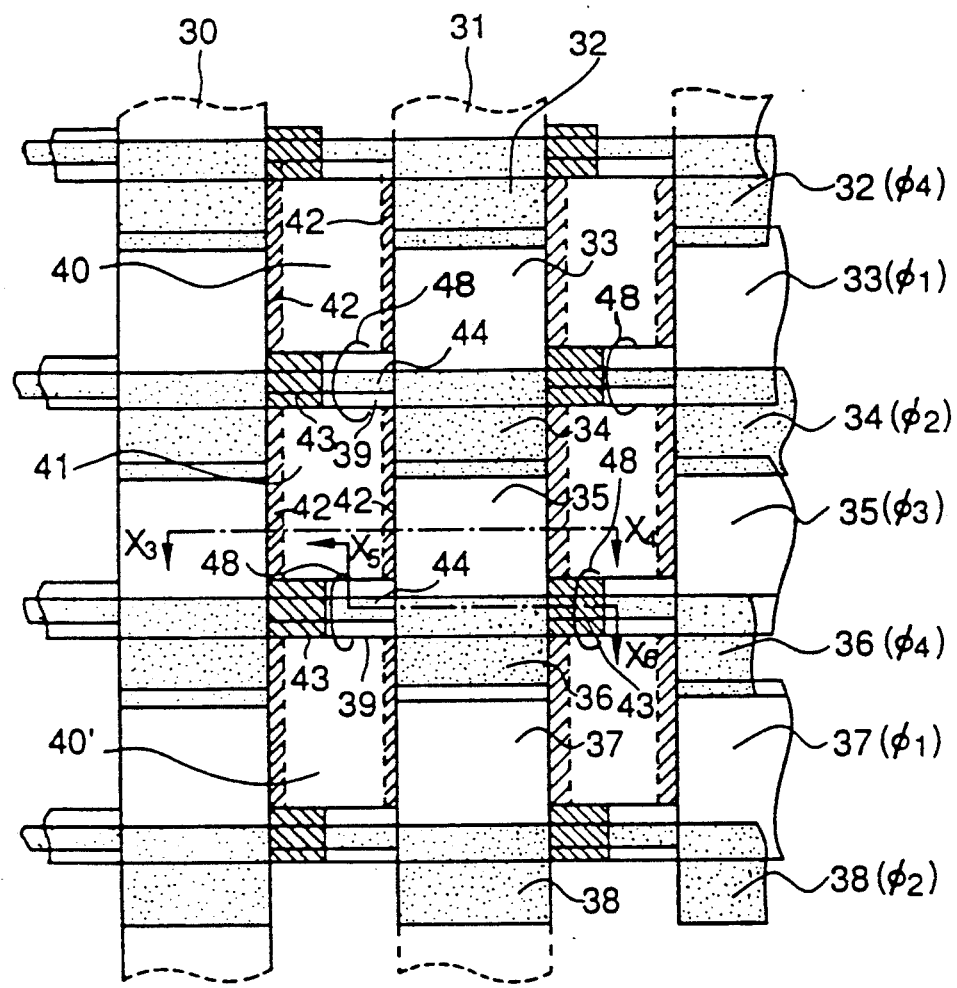
FIG. 8 is a plan view showing the structure of a solid-state imaging device according to a third embodiment of this invention.

A third embodiment of the invention of this application is shown in FIG. 8.

This embodiment is similar to the embodiment of FIG. 4, but differs from the latter in that the width of the interconnection portion between photosensitive element is enlarged on the transfer electrode side, i.e., on the side to which charges are transferred. The width enlarged portion of the interconnection portion may be formed linear or curved.

By allowing the interconnection portion to be formed above, transfer of charges is smoothly carried out.

In the case as shown in FIG. 7, such an enlargement of width may be applied only to the side where no device isolation layer 42 is formed.

It should be noted that this invention is not limited to the above-described embodiments, but may be applied to the structure in which the interconnection portion between photosensitive elements serving as the photosensitive element train in the prior art is used as the transport channel.

Further, the photosensitive element may be simply an n-type structure or a MOS type electrode structure. In addition, a p-type or an n-type impurity layer having a predetermined concentration may be formed in the substrate region 50 serving as the transport channel at the interconnection portion. In this case, by forming a p-type impurity layer having a concentration lower than that of the p-type region 43 for isolation and higher than that of the p-well 46, thereby it is possible to reduce the crosstalk between devices.

While it has been described in the embodiment shown in FIG. 7 that signal charges are taken out only from the photosensitive element on the upper side of the figure, an approach may be employed to form device isolation layer 51 at the boundary portion on the opposite side of the photosensitive element to take out only signal charges from the photosensitive element on the lower side.

I claim:

1. A solid-state imaging device comprising:
a photosensitive element array in which photosensitive element trains are arranged in parallel with a predetermined spacing therebetween, each of said photosensitive element trains being such that a plurality of photosensitive elements at least partially isolated from each other by device isolation regions are arranged in a train form, and each of said photosensitive element trains being comprised of photosensitive elements arranged in a charge transfer direction,
charge transfer sections each including charge transfer channel layers and a plurality of transfer electrodes thereabove, arranged between said respective photosensitive element trains, and isolated from at least a portion adjacent to said photosensitive element array by said device isolation regions,
channel regions formed in the regions between said photosensitive elements of each of said trains, each of said channel regions being formed adjacent to two photosensitive elements in one of said trains, in a manner that they are adjacent to said device isolation regions and are connected to said charge transfer channel layers, and
interconnection layers for connecting the electrodes in phase of said transfer electrodes provided above said device isolation regions and said channel regions,
wherein by controlling voltages applied to said transfer electrodes and said interconnection layers, each of said channel regions between photosensitive elements is permitted to be used as a charge transport channel for transporting signal charges produced in said photosensitive elements to said charge transfer channel.

2. A solid-state imaging device as set forth in claim 1, wherein there are provided two conductive layers insulated from each other, integrally formed with corresponding transfer electrodes of respective charge transfer sections above the region between respective photosensitive elements serving as said photosensitive trains, and for delivering transfer control voltages to these transfer electrodes, and wherein said charge transport channel is formed within a semiconductor substrate provided with no device isolation layer below a first voltage supply electrode closest to the semiconductor surface through an insulating layer.

3. A solid-state imaging device as set forth in claim 2, wherein said charge transport channel is formed close to two photosensitive elements adjacent to each other in order to add signal charges in said two photosensitive element and transport them at the same time.

4. A solid-state imaging device as set forth in claim 2, wherein, in order to permit said charge transport channel to transport charges only from a single photosensitive element, an additional isolation region of heavily doped layer of a conductivity type opposite to that of the signal charge is formed at either one of boundary portions of two photosensitive elements which are neighboring said transport channel, said boundary portions facing said transport channel.

5. A solid-state imaging device as set forth in claim 1, wherein said photosensitive element is comprised of an impurity layer of the same conductivity type as that of the signal charge, and an impurity layer of an opposite conductivity type covering the surface portion thereof, a device isolation layer comprised of said impurity layer of said opposite conductivity type being formed in the boundary region between said charge transfer section and said photosensitive element.

6. A solid-state imaging device comprising:
a photosensitive element array in which photosensitive element trains are arranged in parallel with a predetermined spacing therebetween, each of said photosensitive element trains being such that a plurality of photosensitive elements at least partially isolated from each other by device isolation layers are arranged in a train form, charge transfer sections each including charge transfer channel layers and a plurality of transfer electrodes thereabove, arranged between said respective photosensitive element trains, and isolated from at least a portion adjacent to said photosensitive element array by said device isolation layers, channel regions formed in the regions between said photosensitive elements serving as said photosensitive element trains in a manner that they are adjacent to said device isolation layers and are connected to said charge transfer channel layers, and interconnection layers for connecting the electrodes in phase of said transfer electrodes provided above said device isolation layers and said channel regions, wherein by controlling voltages applied to said transfer electrodes and said interconnection layers, each of said channel regions between photosensitive elements is permitted to be used as a charge transport channel for transporting signal charges produced in said photosensitive elements to said charge transfer channel, wherein said charge transport channel is formed in a manner that the width thereof is enlarged in a direction approaching to said charge transfer channel layers.

* * * * *